(12) United States Patent
Baker

(10) Patent No.: US 7,319,620 B2
(45) Date of Patent: Jan. 15, 2008

(54) INPUT AND OUTPUT BUFFERS HAVING SYMMETRICAL OPERATING CHARACTERISTICS AND IMMUNITY FROM VOLTAGE VARIATIONS

(75) Inventor: R. Jacob Baker, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/430,470

(22) Filed: May 8, 2006

(65) Prior Publication Data

US 2006/0203571 A1   Sep. 14, 2006

Related U.S. Application Data

(63) Continuation of application No. 10/927,763, filed on Aug. 27, 2004, now Pat. No. 7,102,932.

(51) Int. Cl.
*G11C 7/10* (2006.01)
(52) U.S. Cl. .................... 365/189.05; 365/189.21
(58) Field of Classification Search ........... 365/189.05, 365/189.21
See application file for complete search history.

(56) References Cited

U.S. PATENT DOCUMENTS

| | | | |
|---|---|---|---|
| 3,943,367 A * | 3/1976 | Baker ..................... 250/551 |
| 4,247,791 A | 1/1981 | Rovell ..................... 307/355 |
| 4,546,476 A | 10/1985 | Shaw et al. ............... 372/6 |
| 5,045,806 A | 9/1991 | Yan ........................ 330/252 |
| 5,227,671 A | 7/1993 | Ehrlich ..................... 307/261 |
| 5,337,090 A | 8/1994 | Ogino et al. ............... 348/626 |
| 5,339,044 A | 8/1994 | Perraud ..................... 330/252 |
| 5,510,754 A | 4/1996 | Moraveji et al. ........... 330/267 |
| 5,703,519 A | 12/1997 | Crook et al. ............... 327/387 |
| 5,898,341 A | 4/1999 | Miyashita .................. 330/253 |
| 5,907,261 A | 5/1999 | Jones ....................... 330/254 |
| 5,982,689 A | 11/1999 | Takahashi .................. 365/205 |
| 6,060,922 A | 5/2000 | Chow et al. ............... 327/175 |
| 6,204,980 B1 | 3/2001 | Momtaz et al. ............. 360/29 |
| 6,281,731 B1 | 8/2001 | Fifield et al. .............. 327/205 |
| 6,300,836 B1 | 10/2001 | Belyi ....................... 330/288 |
| 6,525,604 B2 | 2/2003 | Eckert et al. .............. 330/69 |
| 6,665,354 B1 | 12/2003 | Drapkin et al. ............ 375/316 |
| 6,670,859 B2 | 12/2003 | Sanduleanu ................ 331/57 |
| 6,759,904 B2 * | 7/2004 | Behzad ..................... 330/254 |
| 6,779,097 B2 | 8/2004 | Gillingham et al. ........ 711/167 |
| 6,856,197 B1 | 2/2005 | Humphrey .................. 330/252 |
| 6,943,622 B2 * | 9/2005 | Ranganathan .............. 330/69 |
| 6,956,779 B2 | 10/2005 | Tran ........................ 365/205 |
| 6,956,781 B2 | 10/2005 | Oyama ...................... 365/207 |
| 7,102,932 B2 * | 9/2006 | Baker ....................... 365/189.05 |
| 2003/0103400 A1 | 6/2003 | Van Tran ................... 365/207 |

* cited by examiner

*Primary Examiner*—Tuan T. Nguyen
(74) *Attorney, Agent, or Firm*—Dorsey, Whitney, LLP

(57) ABSTRACT

A pair of self-biased differential amplifiers having a non-symmetrical topology are combined to provide a self-biased differential amplifier having a symmetrical topology. Each of the combined differential amplifiers includes a pair of transistors coupled to each other as a current mirror. The current mirror transistors are coupled in series with a respective one of a pair of differential input transistors. A current source transistor is coupled to the differential input transistors, and it is self-biased by one of the current mirror transistors.

39 Claims, 9 Drawing Sheets

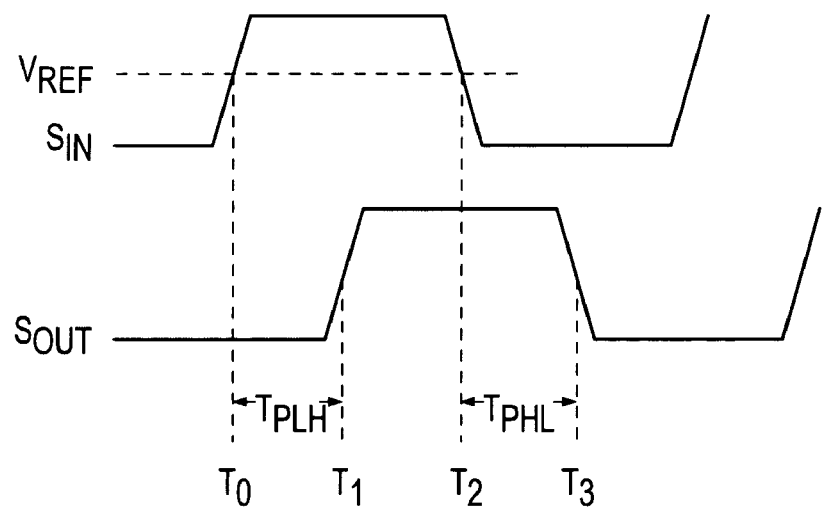
FIG.1A PRIOR ART
FIG.1B PRIOR ART
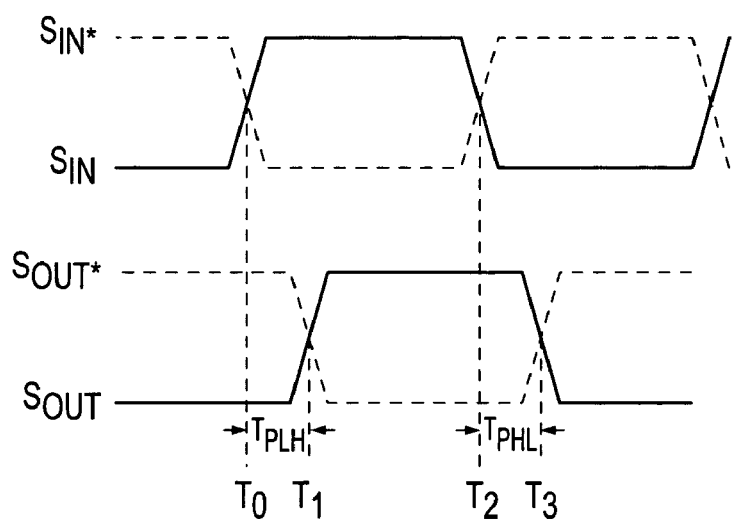
FIG.2A PRIOR ART
FIG.2B PRIOR ART

INPUT AND OUTPUT BUFFERS HAVING SYMMETRICAL OPERATING CHARACTERISTICS AND IMMUNITY FROM VOLTAGE VARIATIONS

CROSS-REFERENCE TO RELATED APPLICATION

This application is a continuation of pending U.S. patent application Ser. No. 10/927,763, filed Aug. 27, 2004, now U.S. Pat. No. 7,102,932.

TECHNICAL FIELD

This invention relates to buffers of the type normally used to input and output signals in memory devices and other electronic devices, and more particularly to a buffer that responds to rising and falling edges of a digital signal in essentially the same manner with a timing that is substantially insensitive to supply voltage and other voltage variations.

BACKGROUND OF THE INVENTION

Input and output buffers are commonly used in a wide variety of electrical devices to couple digital signals to or from the electrical devices. The buffers generally provide a high input impedance to avoid excessively loading circuits to which they are connected, and they have a low output impedance to simultaneously drive electrical circuits without excessive loading. Input buffers are used, for example, to couple command, address and write data signals from command, address and data buses, respectively, of memory devices, including dynamic random access memory ("DRAM") devices. Output buffers are used in memory devices, for example, to couple read data to the data bus.

As the operating speed of memory devices continues to increase, the timing at which command, address and write data signals, as well as other signals, are coupled to circuits in memory devices has become more critical. Similarly, the timing at which read data signals are coupled to external devices, such as memory controllers, has also become more critical. The manner in which input buffers and output buffers couple signals has therefore become very important to the high speed operation of memory devices. With reference to FIG. 1A, an input signal $S_{IN}$ applied to a buffer transitions from a low or binary "0" value to a high or binary "1" value at time $t_0$. The input signal $S_{IN}$ then transitions from the high value to the low value at time $t_2$. In many cases, the voltage of the input signal $S_{IN}$ is compared to a reference voltage $V_{REF}$, and the buffer switches when the magnitude of the input signal $S_{IN}$ increases above $V_{REF}$ or decreases below $V_{REF}$.

In response to the transitions of the input signal $S_{IN}$, the buffer produces an output signal $S_{OUT}$, which is shown in FIG. 1B. In response to the low-to-high transition of the input signal $S_{IN}$, the output signal $S_{OUT}$ also transitions from low-to-high, and it reaches the midpoint of such transition at time $t_1$. Similarly, the $S_{OUT}$ signal reaches the midpoint of its high-to-low transition responsive to the high-to-low transition of the input signal at time $t_3$. The delay of the output signal $S_{OUT}$ after the low-to-high transition of the $S_{IN}$ signal is commonly designated as $t_{PLH}$. Similarly, the delay of the output signal $S_{OUT}$ after the high-to-low transition of the $S_{IN}$ signal is commonly designated as $t_{PHL}$. It is desirable for the magnitude of $t_{PLH}$ to be the same as the magnitude of $t_{PHL}$, which requires that the buffer have symmetrical operating characteristics. It is generally even more important that $t_{PLH}$ and $t_{PHL}$ remain constant despite environmental changes, such as changes in the magnitude of a supply voltage $V_{CC}$ or the reference voltage $V_{REF}$. Otherwise, timing relationships will vary with these environmental changes, thus making it impossible for memory devices to operate at very high speeds where timing tolerances are very small.

FIGS. 1A and 1B show the operation of a "single-ended" buffer that receives a single input signal $S_{IN}$ and outputs a single output signals $S_{OUT}$. However, buffers used in memory devices and other electronic devices are often differential buffers that receive complementary input signals $S_{IN}$, $S_{IN}*$ and output complementary output signals $S_{OUT}$, $S_{OUT}*$. However, variations are also common, such as buffers that receive a single input signal $S_{IN}$ and output complementary output signals $S_{OUT}$, $S_{OUT}*$ as well as buffers that receive complementary input signals $S_{IN}$, $S_{IN}*$ and output a single output signals $S_{OUT}$.

The operating characteristics of a buffer receiving complementary input signals $S_{IN}$, $S_{IN}*$ and outputting complementary output signals $S_{OUT}$, $S_{OUT}*$ is shown in FIGS. 2A and 2B. With reference to FIG. 2A, complementary input signals $S_{IN}$, $S_{IN}*$ applied to a buffer have a first transition at time $t_0$ and a second transition opposite the first transition at time $t_2$. The voltage of the input signals $S_{IN}$, $S_{IN}*$ are generally compared to each other, and the buffer switches when the magnitude of the input signal $S_{IN}$ increases above the $S_{IN}*$ signal or decreases below the $S_{IN}*$ signal.

As shown in FIG. 2B, the output signals $S_{OUT}$, $S_{OUT}*$ transition in response to the first and second transitions of the input signals $S_{IN}$, $S_{IN}*$ at times $t_1$ and $t_2$, respectively. Again, the delay between $t_0$ and $t_1$ can be designated as $t_{PLH}$, and the delay between $t_2$ and $t_3$ can be designated as $t_{PHL}$. It is also important for $t_{PLH}$ to have the same as the magnitude as $t_{PHL}$, and for both of those parameters to be insensitive to environmental changes.

A variety of input buffers and output buffers are in common use. Some of these buffers have non-symmetrical topologies that tend to result in non-symmetrical operating characteristics. Even if the buffers do not have non-symmetrical operating characteristics, their $t_{PLH}$ and $t_{PHL}$ parameters may vary excessively with environmental changes. For example, a self-biased differential amplifier 10 as shown in FIG. 3 is commonly used as an input buffer in memory devices. The amplifier 10 includes a pair of PMOS transistors 14, 16 coupled to each other and to a supply voltage $V_{CC}$ to act as a current mirror so that current through the transistor 14 is equal to the current through the transistor 16. The current mirror operates by the transistor 14 sensing the current passing through it and generating a voltage that is used to control both transistors 14, 16. The drains of the transistors 14, 16 are coupled to respective NMOS transistors 20, 24, which receive complementary input signals $V_{IN+}$ and $V_{IN-}$ at their gates, respectively. However, a reference voltage is often applied to the amplifier 10, and the amplifier operates as a "single-ended" amplifier receiving a single input signal. The transistors 20, 24 function as a differential amplifier to produce an output signal $V_{OUT+}$ at the drain of the NMOS transistor 24 that has a magnitude that is proportional to the difference between $V_{IN+}$ and $V_{IN-}$. However, in other implementations, the amplifier 10 produce output signal $V_{OUT+}$ and $V_{OUT-}$ at the drain of the NMOS transistor 24 and the drain of the NMOS transistor 20, respectively. Finally, an NMOS transistor 28 coupled to the sources of both NMOS transistors 20, 24 acts as a current sink to set the current flowing through the transistors 20, 24. The transistor 28 is biased by coupling its gate to the drain of the transistor 20.

The differential amplifier is referred to as "self-biased" because the bias voltage applied to the gate of the current sink transistor 28 is automatically adjusted to maintain the current through the transistor 28 constant as the supply voltage $V_{CC}$ and the temperature of the amplifier 10 change. For example, if the current is reduced because of these changes, the voltage drop across the PMOS transistor 14 is reduced so that the bias voltage applied to the gate of the current sink transistor 28 is increased. As a result, the current through the PMOS transistor 14 is brought back to its original value. In a similar manner, if the current through the transistor 14 increases, the bias voltage applied to the gate of the current sink transistor 28 decreases so that the transistor 28 reduces the current through the PMOS transistor 14 back to its original value.

The self-biased differential amplifier 10 provides good performance in a large number of applications. It is partly for that reason it is so widely used. However, it is apparent from FIG. 3 that the amplifier 10 has a non-symmetrical topology. In particular, the drain of only the PMOS transistor 14 is connected to the gates of the transistors 14, 16. The gate of the PMOS transistor 16 has no similar connection. Furthermore, the output signal $V_{OUT+}$ of the differential amplifier 10 is taken from the drain of the NMOS transistor 24. Even if the amplifier 10 provided a differential output by taking an output signal from the drain of the NMOS transistor 20, the amplifier would still have a non-symmetrical topology.

The non-symmetrical topology of the amplifier 10 causes its operating characteristics to be non-symmetrical so that response of the amplifier 10 to low-to-high transitions of the input signals $V_{IN+}$ and $V_{IN-}$, i.e., $t_{PLH}$, does not match the response of the amplifier 10 to high-to-low transitions of the input signals $V_{IN+}$ and $V_{IN-}$, i.e., $t_{PHL}$. Similar problems exist for other input and output buffer circuits that have non-symmetrical topologies.

There is therefore a need for a buffer circuit that has a symmetrical configuration so that it responds to low-to-high transitions of input signals in the same manner that it responds to high-to-low transitions of input signals.

SUMMARY OF THE INVENTION

A method of designing an input or output buffer by combining first and second buffer circuits each of which have a non-symmetrical topology. The first and second buffer circuit are combined by coupling the first buffer circuit to the second buffer circuit in a manner that results in a buffer having a symmetrical topology. The resulting buffer includes first and second transistors coupled to each other in a current mirror configuration, and third and fourth transistors coupled to each other in a current mirror configuration. Each of a pair of differential input transistors receive a respective input signal at its gate, and it is coupled to one of the transistors in a respective one of the current mirrors. A pair of current source transistors are coupled to the differential input transistors, and they are biased by one of the transistors in a respective one of the current mirrors.

BRIEF DESCRIPTION OF THE DRAWINGS

FIGS. 1A and 1B are timing diagrams showing the response of a conventional single-ended buffer to transitions of an input signal.

FIGS. 2A and 2B are timing diagrams showing the response of a conventional differential buffer to transitions of an input signal.

DETAILED DESCRIPTION

Figure 3:
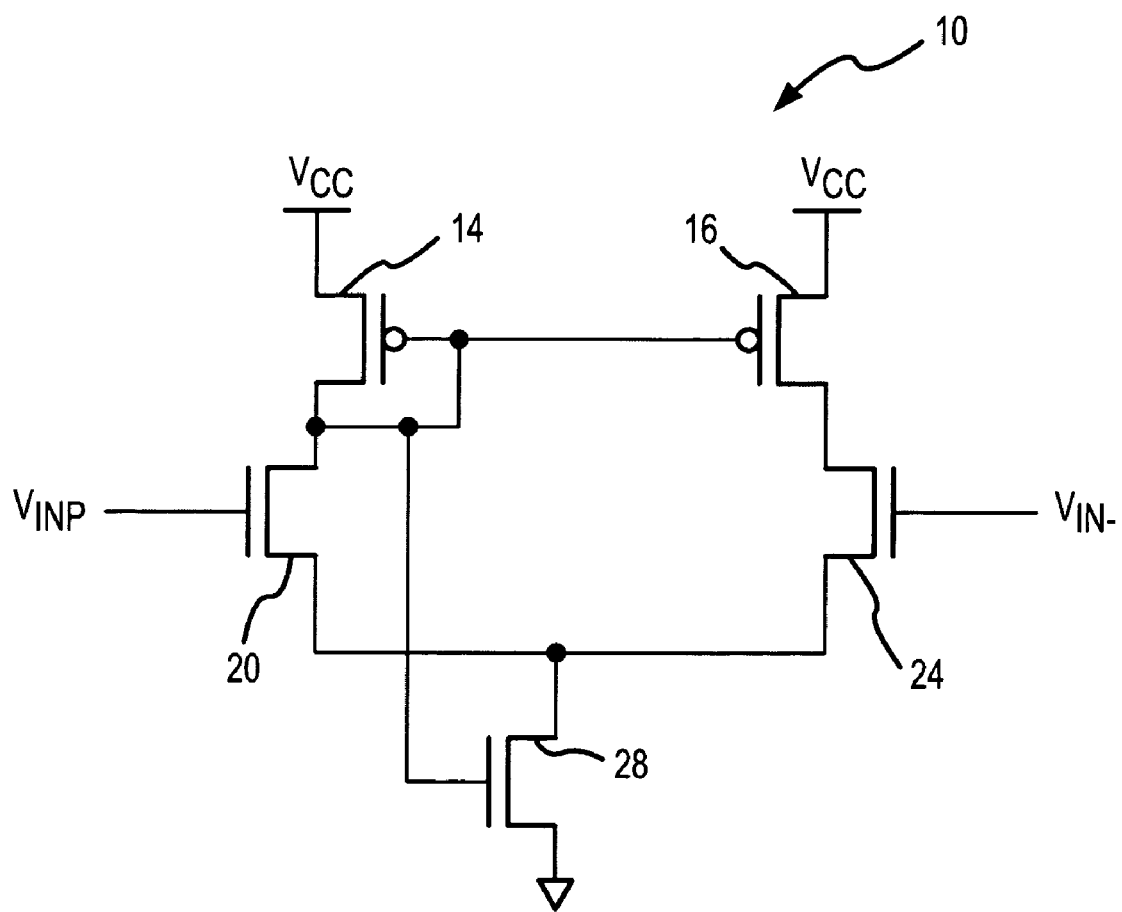
FIG. 3 is a schematic diagram of a conventional self-biased differential amplifier that is commonly used as a buffer.

In accordance with one embodiment of the invention, a pair of the non-symmetrical differential amplifier 10 of FIG. 3 can be combined to provide a symmetrical differential amplifier that has symmetrical operating characteristics. However, essentially the same technique can be used to provide a symmetrical buffer from other types of buffers having a non-symmetrical topology.

Figure 4:
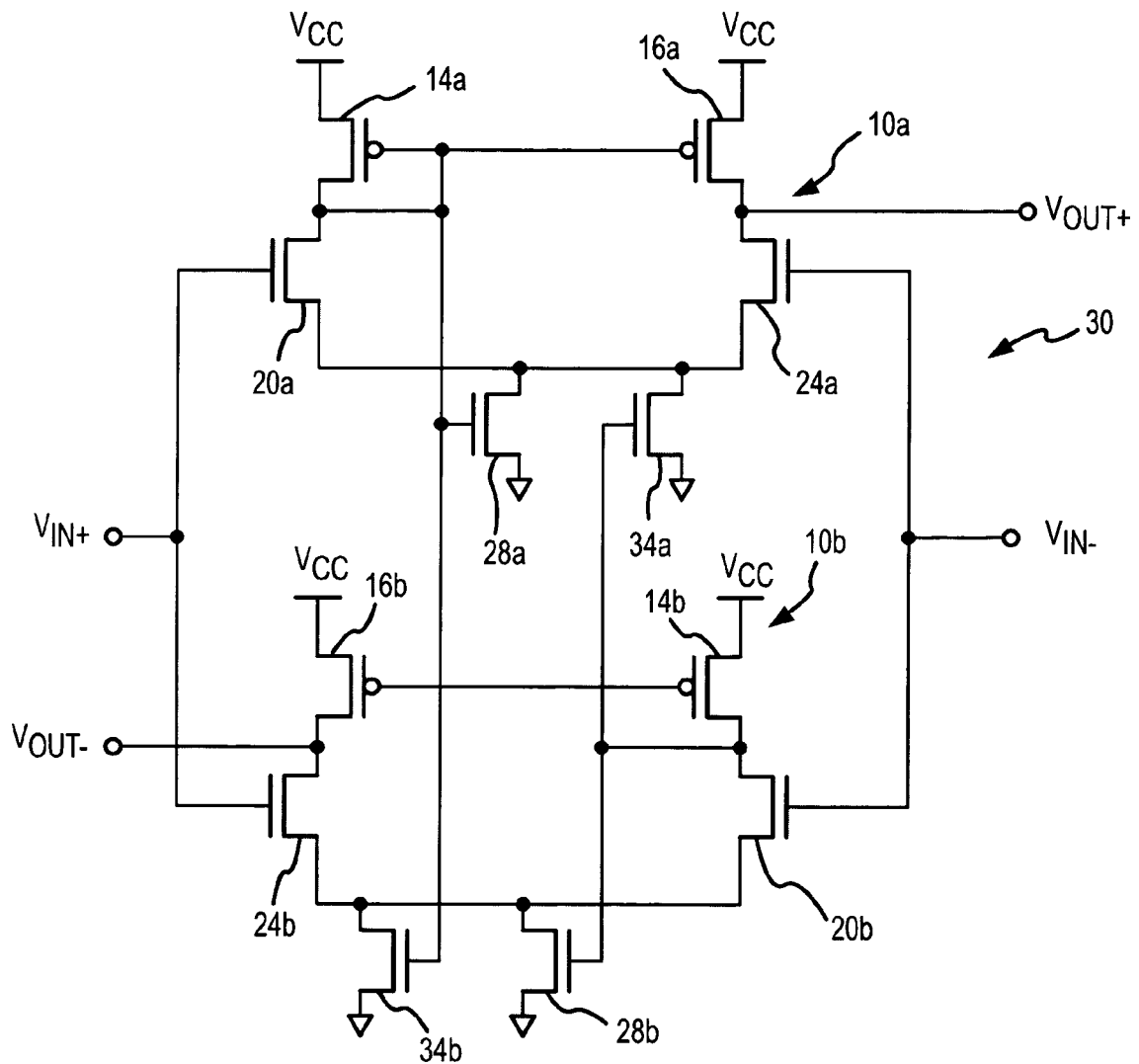
FIG. 4 is a schematic diagram of a symmetrical self-biased differential amplifier according to one embodiment of the invention.

With reference to FIG. 4, a pair of the differential amplifiers 10a,b are modified and coupled to each other to provide a differential amplifier 30 having a symmetrical topology. Specifically, a second NMOS current sink transistor 34a,b is provided in each amplifier 10a,b in parallel with the current sink transistor 28a,b. The PMOS transistor 14a in the current mirror of the first amplifier 10a is then coupled to the gate of the added current sink transistor 34b in the second amplifier 10b as well as to the existing current sink transistor 28a. Similarly, the PMOS transistor 14b in the current mirror of the second amplifier 10b is coupled to the gate of the added current sink transistor 34a in the first amplifier 10a as well as to the existing current sink transistor 28b. The input and output connections of the second amplifier 10b are reversed from the input and output connections of the first amplifier 10a. Specifically, the $V_{IN+}$ input signal is applied to the gate of the transistor 20a in the first amplifier 10a and to the gate of the transistor 24b in the second amplifier 10b. In the same manner, the $V_{IN-}$ input signal is applied to the gate of the transistor 24a in the first amplifier 10a and to the gate of the transistor 20b in the second amplifier 10b. The $V_{OUT+}$ output of the first amplifier 10a is taken from the drain of the NMOS transistor 16a, and the $V_{OUT-}$ output of the second amplifier 10b is also taken from the drain of the NMOS transistor 16b. Thus, the outputs of both amplifiers 10a,b are taken from the same circuit node. As a result, the amplifier 30 has an entirely symmetrical topology, and it therefore has symmetrical operating characteristics. The current sink transistors 28a,b and 34a,b preferably have a relatively high conductive resistance to minimize the power consumption of the amplifier 30.

Figure 5:
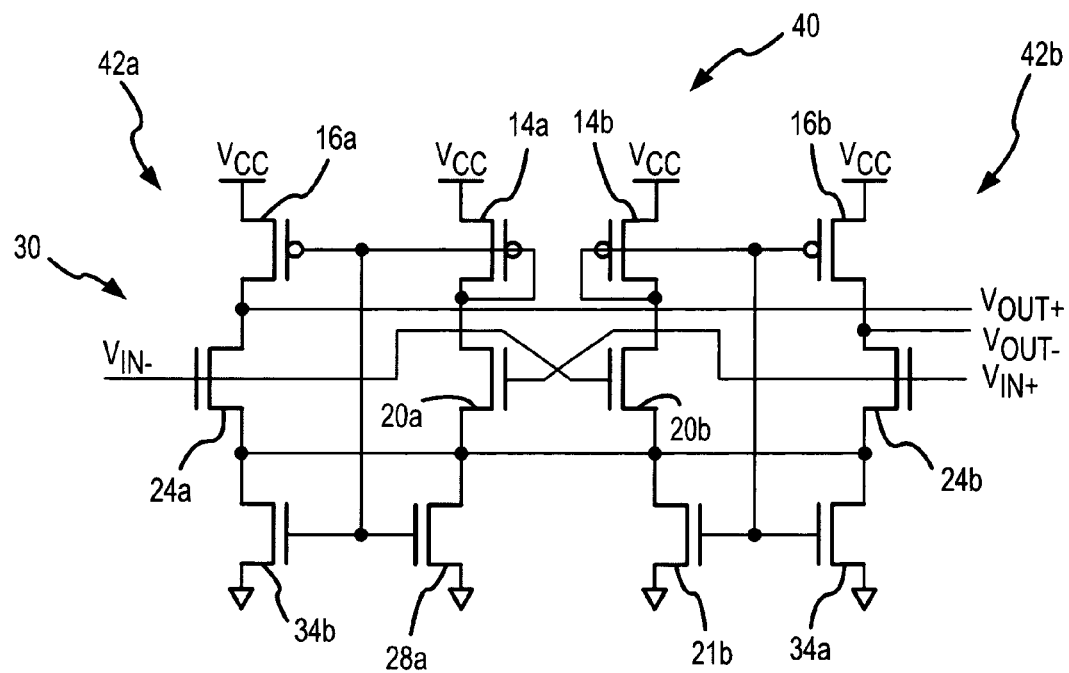
FIG. 5 is a schematic diagram of the amplifier of FIG. 4 drawn in a different manner.

The self-biased differential amplifier 30 can be redrawn as shown in FIG. 5 so that its symmetrical topology is even more apparent. As shown in FIG. 5, the amplifier 30 includes a center section 40, which includes the current sensing transistors 14a, 14b in the current mirrors, and two side sections 42a,b. In operation, the voltages in the center section 40 remain substantially constant to provide common-mode feedback to help insure the symmetrical operating characteristics of the amplifier 30. The voltages in the side sections 42a,b vary to a greater extent with changes in the input signals $V_{IN+}$, $V_{IN-}$, and it is these sections 42a,b that provide the output signals $V_{OUT+}$, $V_{OUT-}$.

Figure 6:
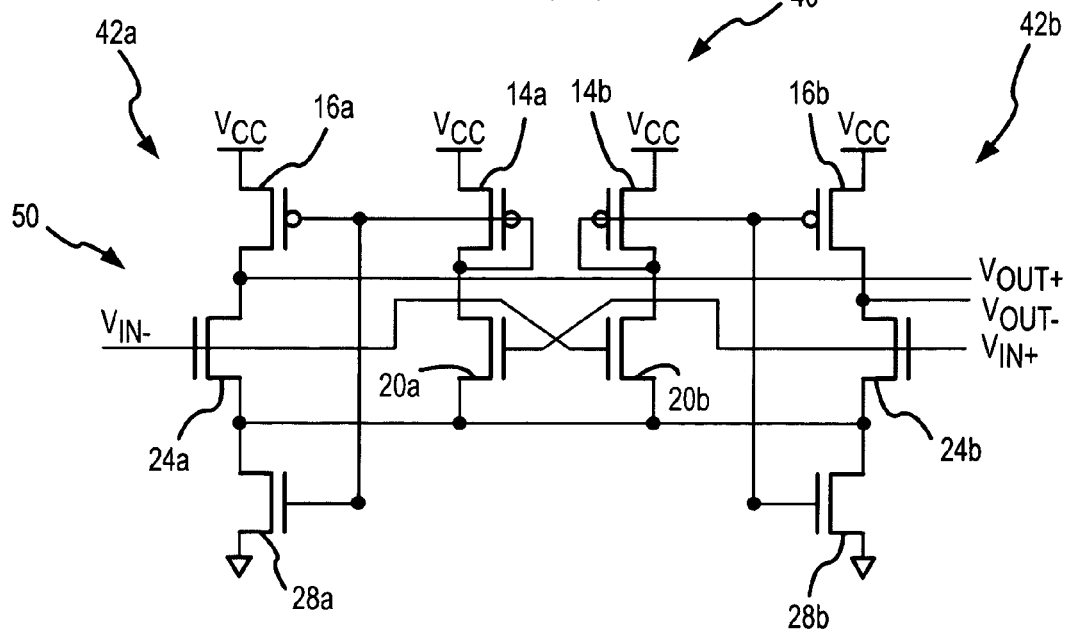
FIG. 6 is a schematic diagram of a symmetrical self-biased differential amplifier according to another embodiment of the invention obtained by modifying the amplifier of FIG. 4.

The amplifier 30 shown in FIGS. 4 and 5 can be modified to improve its performance in several respects while still maintaining its symmetrical topology and performance. For example, since the drain of the current mirror sensing transistor 14a is coupled to the gate of two current sink transistors 28a, 34b that are in parallel with each other, the added current sink transistor 34b can be eliminated, as shown in the amplifier 50 of FIG. 6. For the same reason, the added current sink transistor 34a can be eliminated. Eliminating the transistors 34a,b not only reduces the number of transistors needed for the amplifier 50, but it allows the conductive resistance of the remaining current sink transistors 28a,b to be reduced without increasing power consumption since there are no longer current sink transistors in parallel with the transistors 28a,b.

Figure 7:
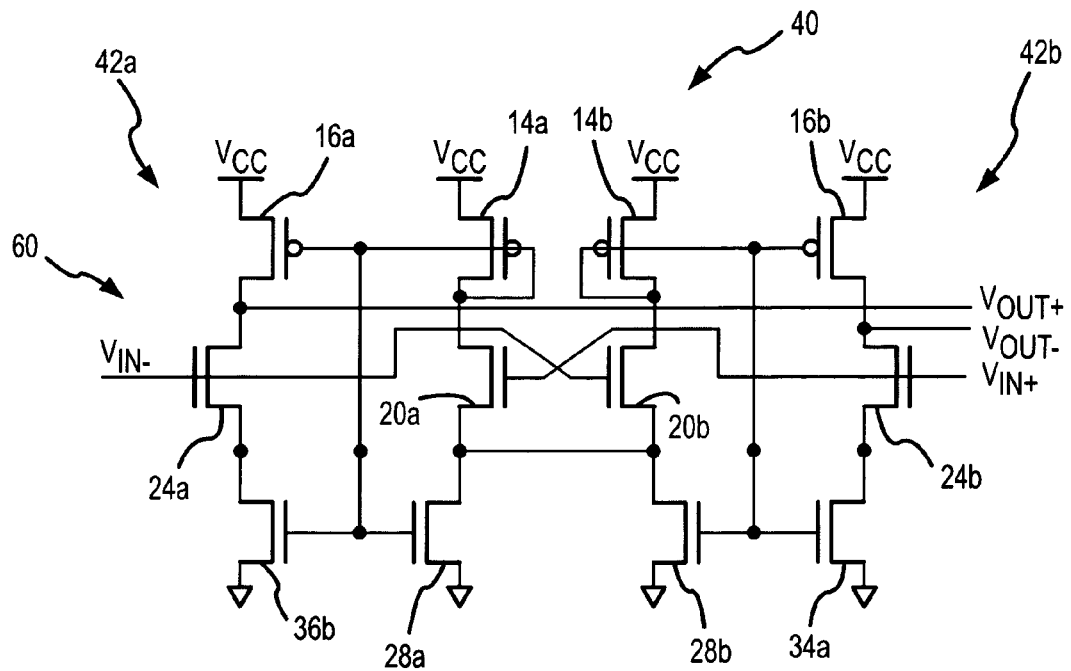
FIG. 7 is a schematic diagram of another embodiment of a symmetrical self-biased differential amplifier obtained by modifying the amplifier of FIG. 4.

As another example, the gain of the amplifier 30 can be improved at the expense of a slight reduction in symmetrical performance by breaking the connection between the original current sink transistors 28a,b and the added current sink transistors 34a,b. The resulting amplifier 60 is shown in FIG. 7. Since the drains of current sink transistors 28a,b are no longer coupled to the drains of the current sink transistors 34a,b in the center section, the output signals $V_{OUT+}$, $V_{OUT-}$ vary to a greater extent in response to variations in the input signals $V_{IN+}$, $V_{IN-}$.

Figure 8:
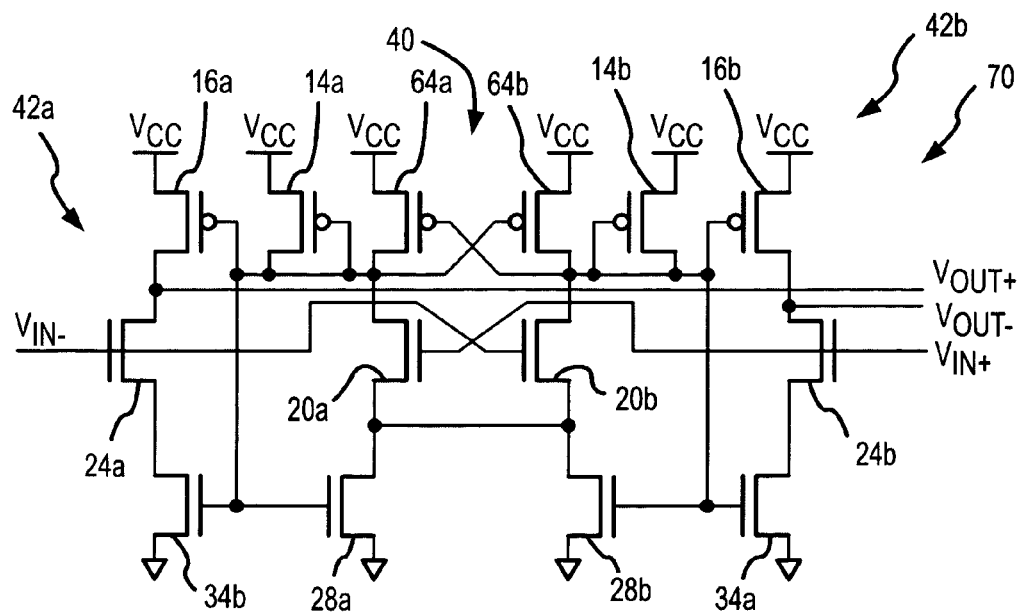
FIG. 8 is a schematic diagram of a further embodiment of a symmetrical self-biased differential amplifier obtained by modifying the amplifier of FIG. 4.

By way of further example, the amplifier 30 shown in FIGS. 4 and 5 can be modified to reduce current consumption as shown in FIG. 8. With reference to FIG. 8, the modified amplifier 70 adds a pair of cross-coupled PMOS transistors 64a,b. The modified amplifier 70 also breaks the connection between the drains of the transistors 28a, 34b and between 28b, 34a as in the amplifier 60 of FIG. 7. The transistor 64a is in parallel with the PMOS transistor 14a between $V_{CC}$ and the drain of the transistor 20a, and the transistor 64b is in parallel with the PMOS transistor 14b between $V_{CC}$ and the drain of the transistor 20b. As mentioned above, the current sink transistors 28a,b and 34a,b in the amplifier 30 preferably have a high conductive resistance, which is achieved by making the conductive channels of the transistors 28a,b and 34a,b relatively long. Using the amplifier 70 with the added PMOS transistors 64a,b, power consumption can be reduced without the need to use current sink transistors 28a,b and 34a,b having relatively long conductive channels. Furthermore, the addition of the PMOS transistors 64a,b allow the amplifier 70 to operate with a lower value of supply voltage $V_{CC}$.

Figure 9:
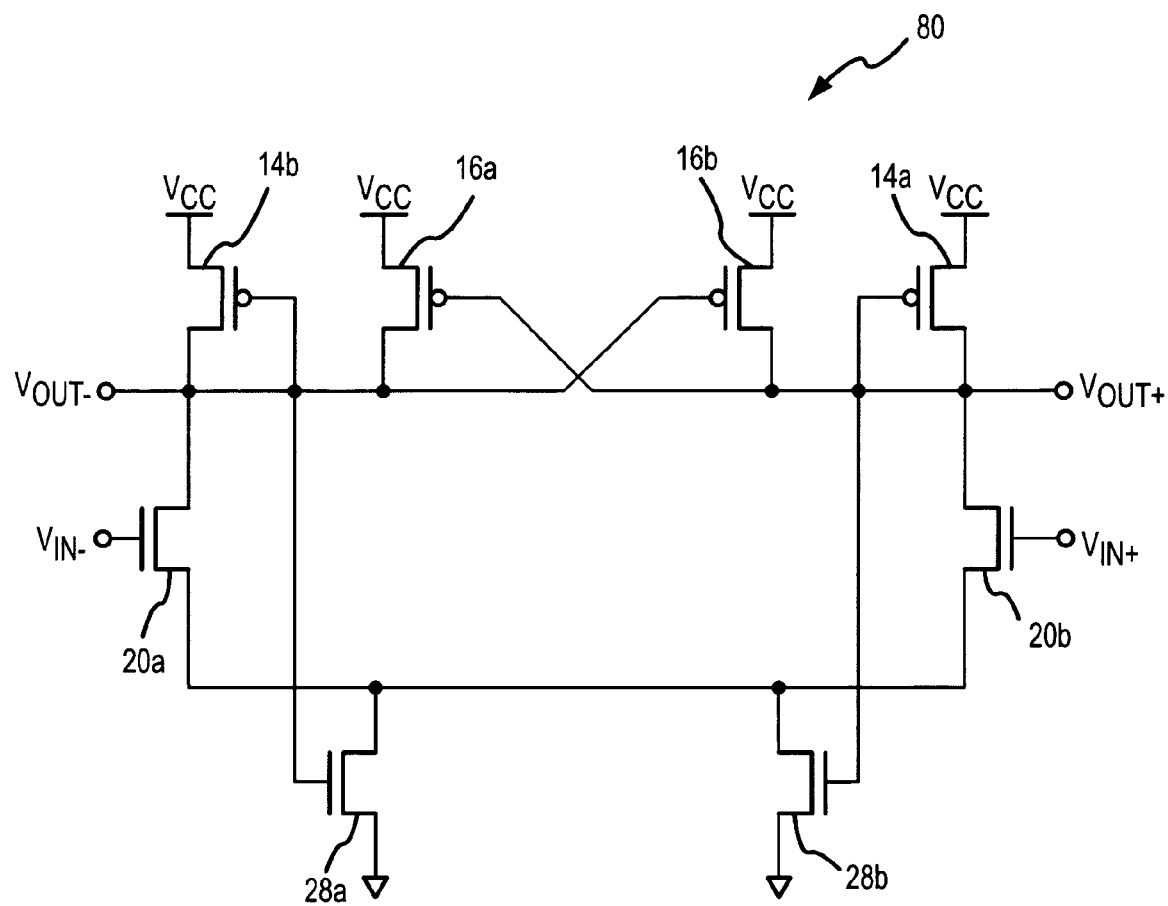
FIG. 9 is a schematic diagram of still another embodiment of a symmetrical self-biased differential amplifier obtained by modifying the amplifier of FIG. 4.

Finally, as shown in FIG. 9, the amplifier 30 shown in FIGS. 4 and 5 can be modified by eliminating not only the added current sink transistors 34a,b, but also by eliminating the differential transistors 24a and 24a. The resulting amplifier 80 is entirely symmetrical, and it therefore provides symmetrical operating characteristics. The amplifier 80 represents the most basic configuration of an amplifier obtained by combining two of the amplifiers 30 shown in FIGS. 4 and 5. Although the current through the current sink transistor 28a will increase responsive to the output voltage $V_{OUT-}$ increasing, that increase in current will be countered by a decrease in the current through the current sink transistor 28b response to the corresponding decrease in the output voltage $V_{OUT+}$. As a result, the total current remains substantially constant. Furthermore, the increase in the output voltage $V_{OUT+}$ increases the resistance of the PMOS transistor 16b to reduce the voltage $V_{OUT-}$, and the decrease in the voltage $V_{OUT-}$ decreases the resistance of the PMOS transistor 16a to increase the voltage $V_{OUT+}$. This feedback characteristic allows the amplifier 80 to provide relatively high gain.

Although a few examples of how the amplifier 30 of FIGS. 4 and 5 can be modified to provide an input or output buffer having symmetrical topologies and operating characteristics, other modifications can also be made. For example, a self-biased differential amplifier using a negative supply voltage can be created from any of the amplifier designs shown in FIGS. 4-9 by simply substituting NMOS transistors for the PMOS transistors shown in FIGS. 4-9, and by substituting PMOS transistors for the NMOS transistors shown in FIGS. 4-9. The resulting amplifier can be combined with one of the amplifiers shown in FIGS. 4-9 to provided a self-biased differential amplifier that can generate output voltages having a range between a positive supply voltage and a negative supply voltage. Other modification and combinations can also be used.

The approach used to create the amplifier 30 by combining two of the amplifiers 10 shown in FIG. 3 to provide a symmetrical amplifier can be generalized to provide an input or output buffer having symmetrical topologies and operating characteristics from virtually input or output buffer having a non-symmetrical topology and operating characteristics. The technique is shown in the flow chart of FIG. 10. First, two such circuits that are "mirror images" of each other are provided in step 90. The two circuits are then connected to each other in a symmetrical manner in step 94. Circuit elements, such as the added current sink transistors 34a,b, are then added in step 96 if necessary to create circuit symmetry. Finally, as shown in step 98, circuit components that are now in parallel with each other or otherwise redundant are eliminated.

Figure 10:
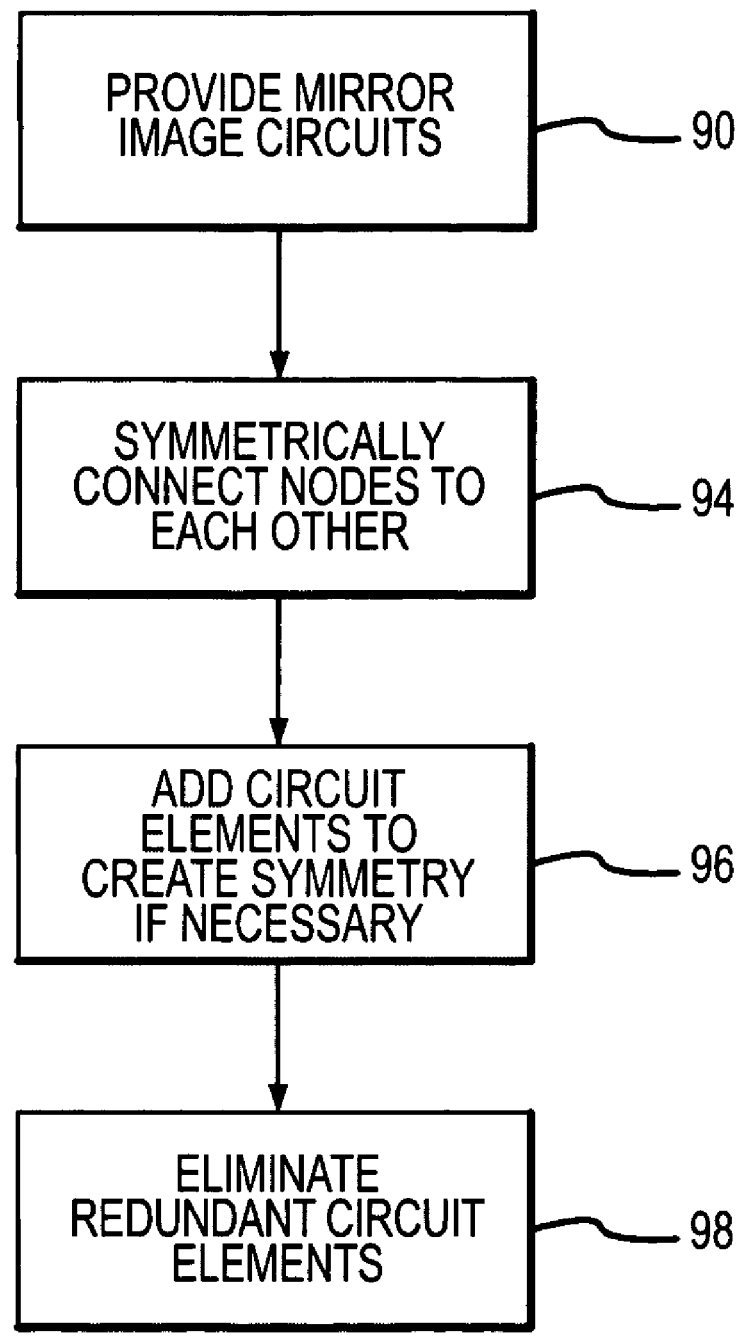
FIG. 10 is a flow chart showing a method of creating a symmetrical input or output buffer by combining non-symmetrical buffers.
Figure 11:
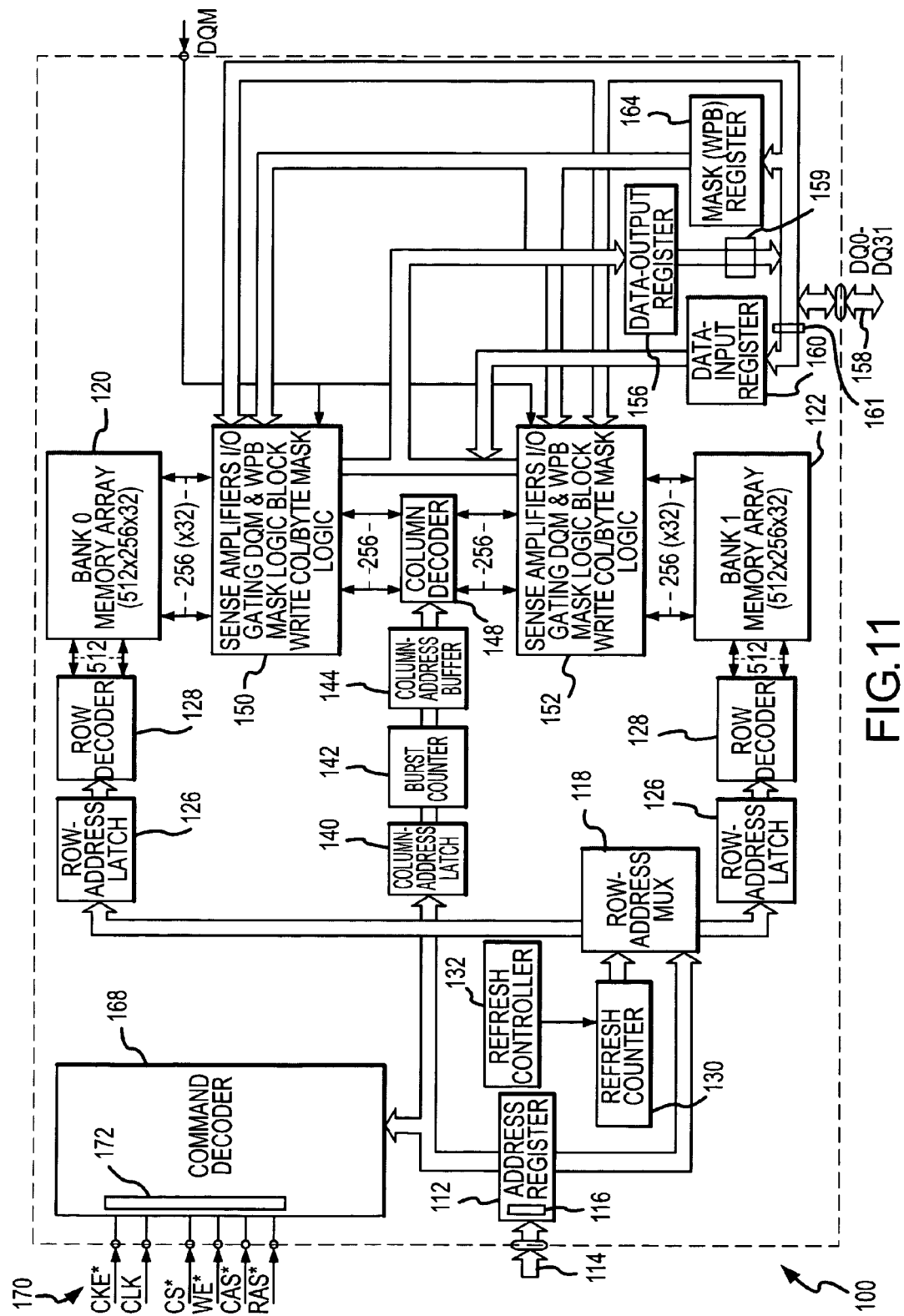
FIG. 11 is a block diagram of an example of a memory device using input buffers and output buffers according to various embodiments of the invention.

Input buffers and output buffers using the self-biased differential amplifiers shown in FIGS. 4-9 or some other embodiment of the invention or a circuit generated using the design technique shown in FIG. 10 can be used in a memory device, as shown in FIG. 11. The memory device illustrated therein is a synchronous dynamic random access memory ("SDRAM") 100, although various embodiments of input and output buffers according to the present invention can be used in other types of memory devices, as well as other types of digital devices. The SDRAM 100 includes an address register 112 that receives either a row address or a column address on an address bus 114, preferably by coupling address signals corresponding to the addresses though one embodiment of input buffers 116 according to the present invention. The address bus 114 is generally coupled to a memory controller (not shown in FIG. 11). Typically, a row address is initially received by the address register 112 and applied to a row address multiplexer 118. The row address multiplexer 118 couples the row address to a number of components associated with either of two memory banks 120, 122 depending upon the state of a bank address bit forming part of the row address. Associated with each of the memory banks 120, 122 is a respective row address latch 126, which stores the row address, and a row decoder 128, which applies various signals to its respective array 120 or 122 as a function of the stored row address. The row address multiplexer 118 also couples row addresses to the row address latches 126 for the purpose of refreshing the memory cells in the arrays 120, 122. The row addresses are generated for refresh purposes by a refresh counter 130, which is controlled by a refresh controller 132.

After the row address has been applied to the address register 112 and stored in one of the row address latches 126, a column address is applied to the address register 112 and coupled through the input buffers 116. The address register 112 couples the column address to a column address latch 140. Depending on the operating mode of the SDRAM 100, the column address is either coupled through a burst counter 142 to a column address buffer 144, or to the burst counter 142 which applies a sequence of column addresses to the column address buffer 144 starting at the column address output by the address register 112. In either case, the column address buffer 144 applies a column address to a column decoder 148 which applies various signals to respective sense amplifiers and associated column circuitry 150, 152 for the respective arrays 120, 122.

Data to be read from one of the arrays 120, 122 is coupled to the column circuitry 150, 152 for one of the arrays 120, 122, respectively. The data is then coupled through a read data path 154 to a data output register 156. Data from the data output register 156 is coupled to a data bus 158 through data output buffers 159 according to various embodiments of the invention. Data to be written to one of the arrays 120, 122 is coupled from the data bus 158 to a data input register 160 through data input buffers 161 according to various embodiments of the invention. The data input register 160 then couples the write data to the column circuitry 150, 152 where they are transferred to one of the arrays 120, 122, respectively. A mask register 164 may be used to selectively alter the flow of data into and out of the column circuitry 150, 152, such as by selectively masking data to be read from the arrays 120, 122.

The above-described operation of the SDRAM 100 is controlled by a command decoder 168 responsive to command signals received on a control bus 170 though command input buffers 172 according to various embodiments of the invention. These high level command signals, which are typically generated by a memory controller (not shown in FIG. 11), are a clock enable signal CKE*, a clock signal CLK, a chip select signal CS*, a write enable signal WE*, a row address strobe signal RAS*, and a column address strobe signal CAS*, which the "*" designating the signal as active low. Various combinations of these signals are registered as respective commands, such as a read command or a write command. The command decoder 168 generates a sequence of control signals responsive to the command signals to carry out the function (e.g., a read or a write) designated by each of the command signals. These command signals, and the manner in which they accomplish their respective functions, are conventional. Therefore, in the interest of brevity, a further explanation of these control signals will be omitted.

Figure 12:
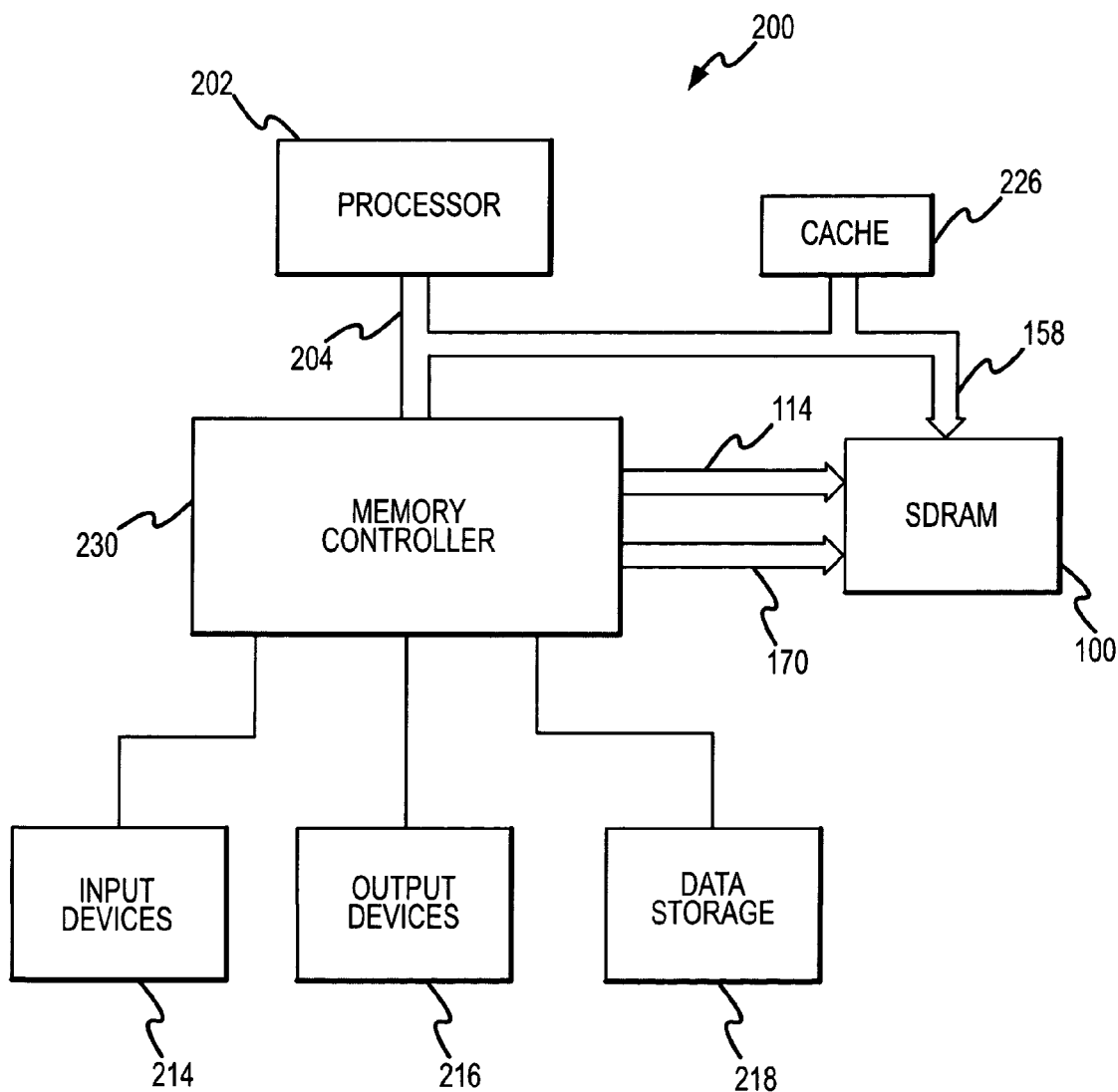
FIG. 12 is a block diagram of a computer system using the memory device of FIG. 11.

FIG. 12 shows a computer system 200 containing the SDRAM 100 of FIG. 11. The computer system 200 includes a processor 202 for performing various computing functions, such as executing specific software to perform specific calculations or tasks. The processor 202 includes a processor bus 204 that normally includes an address bus, a control bus, and a data bus. In addition, the computer system 200 includes one or more input devices 214, such as a keyboard or a mouse, coupled to the processor 202 to allow an operator to interface with the computer system 200. Typically, the computer system 200 also includes one or more output devices 216 coupled to the processor 202, such output devices typically being a printer or a video terminal. One or more data storage devices 218 are also typically coupled to the processor 202 to allow the processor 202 to store data in or retrieve data from internal or external storage media (not shown). Examples of typical storage devices 218 include hard and floppy disks, tape cassettes, and compact disk read-only memories (CD-ROMs). The processor 202 is also typically coupled to cache memory 226, which is usually static random access memory ("SRAM"), and to the SDRAM 100 through a memory controller 230. The memory controller 230 is coupled to the SDRAM 100 through the normally control bus 170 and the address bus 114. The data bus 158 is coupled from the SDRAM 100 to the processor bus 204 either directly (as shown), through the memory controller 230, or by some other means.

Although the present invention has been described with reference to the disclosed embodiments, persons skilled in the art will recognize that changes may be made in form and detail without departing from the spirit and scope of the invention. Such modifications are well within the skill of those ordinarily skilled in the art. Accordingly, the invention is not limited except as by the appended claims.

I claim:

1. A buffer circuit comprising:
a first differential amplifier circuit having a first topology; and
a second differential amplifier circuit having a second topology that is the mirror image of the first differential amplifier circuit, the first differential amplifier circuit being coupled to the second differential amplifier circuit in a manner that results in the buffer circuit having a symmetrical topology, each of the first and second differential amplifier circuits comprising:
a first pair of transistors coupled in a current mirror configuration whose gates are coupled to each other and coupled to the drain of one of the first pair of transistors, and further having its sources coupled to a first supply voltage;
a second pair of transistors each configured to receive an input signal at its gate, wherein the input signals are differential input signals, the second pair of transistors further having its sources coupled to each other and its drains respectively coupled to the drains of the first pair of transistors; and
a third pair of transistors whose drains are coupled to the sources of the second pair of transistors and whose sources are coupled to a second supply voltage.

2. The buffer circuit of claim 1 wherein the first supply voltage comprises a positive supply voltage, and wherein the second supply voltage comprises a ground potential.

3. The buffer circuit of claim 1 wherein the first pair of transistors comprises PMOS transistors and the second and third pair of transistors comprise NMOS transistors.

4. The buffer circuit of claim 1 wherein the first amplifier circuit and the second amplifier circuit are symmetrically coupled together by coupling the gates of the third pair of transistors of the first amplifier circuit to the gates of the third pair of transistors of the second amplifier circuit.

5. The buffer circuit of claim 1 wherein the first amplifier circuit and the second amplifier circuit are symmetrically coupled together by coupling the sources of the second pair of transistors of the first amplifier circuit to the sources of the second pair of transistors of the second amplifier circuit.

6. The buffer circuit of claim 1 wherein the gates of the third pair of transistors are biased by coupling the gates of the third pair of transistors to the gates of the first pair of transistors.

7. The buffer circuit of claim 1 further comprising a fourth pair of transistors coupled in a current mirror configuration and coupled to the first pair of transistors by coupling the gates and drains of the fourth pair of transistors to the gates and drains of the first pair of transistors, and wherein the sources of the fourth pair of transistors are coupled to the first supply voltage.

8. The buffer circuit of claim 1 wherein redundant circuit elements of the first and second amplifier circuits are symmetrically eliminated either to adjust the gain of the buffer circuit or adjust power consumption of the buffer circuit.

9. A buffer circuit comprising:
a first amplifier circuit having a first output terminal providing a first output signal, and having a predetermined group of current mirror transistors and a predetermined group of differential transistors, each of the differential transistors configured to receive one of a pair of differential input signals; and
a second amplifier circuit having a second output terminal providing a second output signal that is complimentary to the first output signal, and having the same number and type of current mirror transistors and the same number and type of differential transistors as the first amplifier circuit, the second amplifier circuit configured to receive the same respective differential input signals, the second amplifier circuit being coupled to the first amplifier circuit in a manner such that the buffer circuit is configured to have a symmetrical topology and symmetrical operating characteristics, each of the first and second amplifier circuits further comprising a predetermined group of current sink transistors operable to counteract variations in the differential input and output signals in a manner such that the total current through the predetermined group of current sink transistors is substantially constant.

10. The buffer circuit of claim 9 wherein the predetermined group of current mirror transistors comprises four PMOS transistors, and wherein the predetermined group of differential transistors comprises two NMOS transistors.

11. The buffer circuit of claim 9 wherein the predetermined group of current sink transistors comprises two NMOS transistors.

12. The buffer circuit of claim 9 wherein redundant circuit elements of the first and second amplifier circuits are symmetrically removed to either adjust the gain of the buffer circuit or power consumption of the buffer circuit.

13. The buffer circuit of claim 9 wherein a predetermined number of circuit elements are symmetrically added to the buffer circuit to adjust either the gain of the buffer circuit or power consumption of the buffer circuit.

14. The buffer circuit of claim 9 wherein the first amplifier circuit symmetrically coupled to the second amplifier circuit further comprises the first output signal at the first output terminal being configured to provide a positive feedback to the second output signal at the second output terminal in a manner that causes the gain of the buffer circuit to increase.

15. The buffer circuit of claim 9 further comprising:
a third amplifier circuit having a predetermined group of current mirror transistors and a predetermined group of differential transistors, each of the differential transistors configured to receive one of a pair of differential input signals; and
a fourth amplifier circuit having the same number and type of current mirror transistors and the same number and type of differential transistors as the third amplifier circuit, the fourth amplifier circuit configured to receive the same respective differential input signal, the first, second, third and fourth amplifier circuits being coupled in a manner such that the buffer circuit is configured to have a symmetrical topology and symmetrical operating characteristics, wherein the buffer circuit is operable to generate a range of output voltages between a positive supply voltage and a negative supply voltage.

16. A memory device, comprising:
a command decoder receiving memory command signals through externally accessible command input terminals, the command decoder generating memory control signals responsive to predetermined combinations of the command signals;
an address decoder receiving address signals through externally accessible address input terminals, the address decoder generating row and column addressing signals responsive to the address signals;
a memory array from which data are read and to which data are written at locations corresponding the address signals responsive to the memory control signals;
a data path extending between a plurality of externally accessible data bus terminals and the memory array for coupling write data signals from the externally accessible data bus terminals to the memory array and read data signals from the memory array to the externally accessible data bus terminals; and
a buffer coupled to one of the externally accessible terminals through which at least one of the command signals, address signals, read data signals or write data signals are coupled, the buffer comprising:
a first differential amplifier circuit having a first topology; and
a second differential amplifier circuit having a second topology that is the mirror image of the first differential amplifier circuit, the first differential amplifier circuit being coupled to the second differential amplifier circuit in a manner that results in the buffer having a symmetrical topology and symmetrical operating characteristics, each of the first and second differential amplifier circuits comprising;
a first predetermined group of transistors coupled in a current mirror configuration whose gates are coupled to each other and coupled to the drain of one of the first pair of transistors, and further having its sources coupled to a first supply voltage;
a second predetermined group of transistors each configured to receive an input signal at its gate, wherein the input signals are differential input signals, the second pair of transistors further having its sources coupled to each other and its drains respectively coupled to the drains of the first pair of transistors; and
a third predetermined group of transistors whose drains are coupled to the sources of the second pair of transistors and whose sources are coupled to a second supply voltage.

17. The memory device of claim 16 wherein the first predetermined group of transistors comprises two PMOS transistors, the second predetermined group of transistors comprises two NMOS transistors and the third predetermined group of transistors comprises two NMOS transistors.

18. The memory device of claim 16 wherein the first amplifier circuit and the second amplifier circuit are symmetrically coupled together by coupling the gates of the third predetermined group of transistors of the first amplifier circuit to the gates of the third predetermined group of transistors of the second amplifier circuit.

19. The memory device of claim 16 wherein the first amplifier circuit and the second amplifier circuit are symmetrically coupled together by coupling the sources of the second predetermined group of transistors of the first amplifier circuit to the sources of the second predetermined group of transistors of the second amplifier circuit.

20. The memory device of claim 16 wherein the gates of the third predetermined group of transistors are biased by coupling the gates of the third predetermined group of transistors to the gates of the first pair of transistors.

21. The memory device of claim 16 wherein the third predetermined group of transistors comprises a predetermined group of current sink transistors operable to counteract variations in the differential input and output signals in a manner such that the total current through the predetermined group of current sink transistors is substantially constant.

22. The memory device of claim 16 further comprising:
a third amplifier circuit having a predetermined group of current mirror transistors and a predetermined group of differential transistors, each of the differential transistors configured to receive a respective one of the differential input signals; and
a fourth amplifier circuit having the same number and type of current mirror transistors and the same number and type of differential transistors as the third amplifier circuit, the fourth amplifier circuit configured to receive the same respective differential input signals, the first, second, third and fourth amplifier circuits being coupled in a manner such that the buffer is configured to have a symmetrical topology and symmetrical operating characteristics, wherein the buffer is operable to generate a range of output voltages between a positive supply voltage and a negative supply voltage.

23. The memory device of claim 16 wherein the first amplifier circuit symmetrically coupled to the second amplifier circuit further comprises a first output signal at a first output terminal being configured to provide a positive feedback to a second output signal at a second output terminal in a manner that causes the gain of the buffer to increase.

24. The memory device of claim 16 wherein redundant circuit elements of the first and second amplifier circuits are symmetrically eliminated either to adjust the gain of the buffer or adjust power consumption of the buffer.

25. The memory device of claim 16 wherein a predetermined number of circuit elements are symmetrically added to the buffer to adjust either the gain of the buffer or power consumption of the buffer.

26. A computer system, comprising:
an integrated circuit processor having a plurality of externally accessible terminals coupled to a processor bus;
an input device coupled to the processor through the processor bus adapted to allow data to be entered into the computer system;
an output device coupled to the processor through the processor bus adapted to allow data to be output from the computer system; and
a memory device coupled to a processor bus, the memory device comprising:
a command decoder receiving memory command signals through externally accessible command input terminals, the command decoder generating memory control signals responsive to predetermined combinations of the command signals;
an address decoder receiving address signals through externally accessible address input terminals, the address decoder generating row and column addressing signals responsive to the address signals;
a memory array from which data are read and to which data are written at locations corresponding the address signals responsive to the memory control signals;
a data path extending between a plurality of externally accessible data bus terminals and the memory array for coupling write data signals from the externally accessible data bus terminals to the memory array and read data signals from the memory array to the externally accessible data bus terminals; and
a buffer coupled to one of the externally accessible terminals through which at least one of the command signals, address signals, read data signals or write data signals are coupled, the buffer comprising:
a first differential amplifier circuit having a first topology; and
a second differential amplifier circuit having a second topology that is the mirror image of the first differential amplifier circuit, the first differential amplifier circuit being coupled to the second differential amplifier circuit in a manner that results in the buffer having a symmetrical topology and symmetrical operation characteristics, each of the first and second differential amplifier circuits comprising;
a first predetermined group of transistors coupled in a current mirror configuration whose gates are coupled to each other and coupled to the drain of one of the first pair of transistors, and further having its sources coupled to a first supply voltage;
a second predetermined group of transistors each configured to receive an input signal at its gate, wherein the input signals are differential input signals, the second pair of transistors further having its sources coupled to each other and its drains respectively coupled to the drains of the first pair of transistors; and
a third predetermined group of transistors whose drains are coupled to the sources of the second pair of transistors and whose sources are coupled to a second supply voltage.

27. The computer system of claim 26 wherein the first predetermined group of transistors comprises two PMOS transistors, the second predetermined group of transistors comprises two NMOS transistors and the third predetermined group of transistors comprises two NMOS transistors.

28. The computer system of claim 26 wherein the first amplifier circuit and the second amplifier circuit are symmetrically coupled together by coupling the gates of the third predetermined group of transistors of the first amplifier circuit to the gates of the third predetermined group of transistors of the second amplifier circuit.

29. The computer system of claim 26 wherein the first amplifier circuit and the second amplifier circuit are symmetrically coupled together by coupling the sources of the second predetermined group of transistors of the first amplifier circuit to the sources of the second predetermined group of transistors of the second amplifier circuit.

30. The computer system of claim 26 wherein the third predetermined group of transistors comprises a predetermined group of current sink transistors operable to counteract variations in the differential input and output signals in a manner such that the total current through the predetermined group of current sink transistors is substantially constant.

31. The computer system of claim 26 further comprising:
a third amplifier circuit having a predetermined group of current mirror transistors and a predetermined group of differential transistors, each of the differential transistors configured to receive a respective one of the differential input signals; and
a fourth amplifier circuit having the same number and type of current mirror transistors and the same number and type of differential transistors as the third amplifier circuit, the fourth amplifier circuit configured to receive the same respective differential input signals, the first, second, third and fourth amplifier circuits being coupled in a manner such that the buffer is configured to have a symmetrical topology and symmetrical operating characteristics, wherein the buffer is operable to generate a range of output voltages between a positive supply voltage and a negative supply voltage.

32. The computer system of claim 26 wherein redundant circuit elements of the first and second amplifier circuits are symmetrically eliminated either to adjust the gain of the buffer or adjust power consumption of the buffer.

33. The computer system of claim 26 wherein a predetermined number of circuit elements are symmetrically added to the buffer to adjust either the gain of the buffer or power consumption of the buffer.

34. A method of designing a buffer circuit comprising:
providing a first amplifier circuit and a second amplifier circuit, the first amplifier circuit having the same circuit elements as the second amplifier circuit; and
coupling the first amplifier circuit and the second amplifier circuit in a manner that results in a buffer circuit having a symmetrical topology and symmetrical operating characteristics, each of the first and second amplifier circuits comprising a predetermined number of current mirror transistors coupled to a predetermined number of differential input transistors and a predetermined number of current source transistors.

35. The method of claim 34 wherein the predetermined number of current mirror transistors comprises two PMOS transistors, and wherein the predetermined number of differential input transistors comprises two NMOS transistors, and the predetermined number of current source transistor comprises two NMOS transistor.

36. The method of claim 34 further comprising adjusting the gain of the buffer circuit by either symmetrically eliminating redundant circuit elements from the first and second amplifier circuits or symmetrically adding a predetermined number of circuit elements to the first and second amplifier circuits.

37. The method of claim 34 further comprising adjusting power consumption of the buffer circuit by either symmetrically eliminating redundant circuit elements from the first and second amplifier circuits or symmetrically adding a predetermined number of circuit elements to the first and second amplifier circuits.

38. The method of claim 34 further comprising increasing the gain of the buffer circuit by providing a positive feedback to an output terminal of the second amplifier circuit when an output signal at an output terminal of the first amplifier circuit is either increased or decreased.

39. The method of claim 34 further comprising:
providing a third amplifier circuit that is oppositely configured relative to the first amplifier circuit;
providing a fourth amplifier circuit that is oppositely configured relative to the second amplifier circuit; and
symmetrically coupling the first, second, third and fourth amplifier circuits in a manner that causes the buffer circuit to generate a range of output voltages between a positive supply voltage and a negative supply voltage.

* * * * *